(12) United States Patent
Hsiang et al.

(10) Patent No.: US 11,469,353 B2
(45) Date of Patent: Oct. 11, 2022

(54) MICRO-LED AND METHOD FOR FORMING THE SAME

(71) Applicant: Acer Incorporated, New Taipei (TW)

(72) Inventors: Jui-Chieh Hsiang, New Taipei (TW); Chih-Chiang Chen, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 100 days.

(21) Appl. No.: 16/747,208

(22) Filed: Jan. 20, 2020

(65) Prior Publication Data

US 2021/0005790 A1 Jan. 7, 2021

(30) Foreign Application Priority Data

Jul. 4, 2019 (TW) ................................ 108123561

(51) Int. Cl.
*H01L 33/50* (2010.01)
*H01L 33/54* (2010.01)
*H01L 33/58* (2010.01)
*H01L 25/075* (2006.01)

(52) U.S. Cl.
CPC ........ *H01L 33/504* (2013.01); *H01L 25/0753* (2013.01); *H01L 33/54* (2013.01); *H01L 33/58* (2013.01); *H01L 2933/005* (2013.01); *H01L 2933/0041* (2013.01); *H01L 2933/0058* (2013.01)

(58) Field of Classification Search
CPC ... H01L 33/504; H01L 25/0753; H01L 33/54; H01L 33/58; H01L 2933/0041; H01L 2933/005; H01L 33/483–486; H01L 33/52–56; G09G 2330/04–045
See application file for complete search history.

(56) References Cited

U.S. PATENT DOCUMENTS

| | | | |
|---|---|---|---|
| 7,098,483 B2 | 8/2006 | Mazzoschette et al. | |
| 2010/0090235 A1* | 4/2010 | Wang | H01L 33/486 257/98 |
| 2013/0300984 A1* | 11/2013 | Lin | G02F 1/133621 349/69 |
| 2014/0339495 A1 | 11/2014 | Bibl et al. | |

OTHER PUBLICATIONS

Chinese language office action dated Oct. 4, 2019, issued in application No. TW 108123561.

* cited by examiner

*Primary Examiner* — Jay C Chang
*Assistant Examiner* — Mikka Liu
(74) *Attorney, Agent, or Firm* — McClure, Qualey & Rodack, LLP (57) ABSTRACT

A micro light-emitting display is provided. The display includes a first transparent micro-cap disposed on a substrate. The first transparent micro-cap includes a first plate portion disposed opposite the substrate, and a first dam portion disposed between the substrate and the first plate portion. The substrate, the first plate portion, and the first dam portion form a first chamber. The display also includes a first micro light-emitting device disposed on the substrate and within the first chamber. The first chamber is in a vacuum or filled with air or an inert gas. In addition, the display includes a first color material layer disposed on the first plate portion and corresponding to the first micro light-emitting device. A method for forming the micro light-emitting display is also provided.

18 Claims, 11 Drawing Sheets

MICRO-LED AND METHOD FOR FORMING THE SAME

CROSS REFERENCE TO RELATED APPLICATIONS

This application claims priority of Taiwan Patent Application No. 108123561, filed on Jul. 4, 2019, the entirety of which is incorporated by reference herein.

BACKGROUND OF THE INVENTION

Field of the Invention

The invention relates to display technology, and in particular to a light-emitting display (LED) with a thermal isolation structure and a method for forming the same.

Description of the Related Art

Conventional light-emitting diodes are typically a size of hundreds of microns. In contrast, micro light-emitting diodes may be tens of microns or less in size. Micro light-emitting diodes have become popular in the field of electronics because they have high brightness, high contrast, wide view angle, long lifespan, and low power consumption.

There have been attempts to use monochrome micro light-emitting diodes in a backlight module. Those monochrome micro light-emitting diodes used in a backlight module exhibit high power consumption. As a result, when the temperature rises, the performance of the micro light-emitting diodes suffers due to the heat-accumulation effect (which results in aging of the color conversion layers the color filter material layer).

Accordingly, a novel micro light-emitting display and a fabrication method thereof, which are capable of addressing or improving the aforementioned problems, are desirable.

BRIEF SUMMARY OF THE INVENTION

Micro light-emitting displays and methods for forming the same are provided. An exemplary embodiment of a micro light-emitting display includes a tint transparent micro-cap disposed on a substrate. The first transparent micro-cap includes a first plate portion disposed opposite the substrate, and a first dam portion disposed between the substrate and the first plate portion. The substrate, the first plate portion, and the first dam portion form a first chamber. The display also includes a first micro light-emitting device disposed on the substrate and within the first chamber. The first chamber is in a vacuum or filled with air or an inert gas. In addition, the display includes a first color material layer disposed on the first plate portion and corresponding to the first micro light-emitting device.

An exemplary embodiment of a method for forming a micro light-emitting display includes forming a first micro light-emitting device on a substrate. The method also includes forming a first transparent micro-cap including a first plate portion and a first dam portion on an edge of the first plate portion to surround the first plate portion. The method further includes forming a first color material layer on the first plate portion. In addition, the method includes bonding the first dam portion of the first transparent micro-cap with the first color material layer onto the substrate. The substrate, the first plate portion, and the first dam portion form a first chamber. The first micro light-emitting device is in the first chamber and the first chamber is in a vacuum or filled with air or an inert gas.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 1G-1 is a cross-sectional vim of an exemplary micro light-emitting display in accordance with some embodiments.

FIG. 1G-2 is a cross-sectional vim of an exemplary micro light-emitting display in accordance with some embodiments.

FIG. 2F-1 is a cross-sectional view of an exemplary micro light-emitting display in accordance with some embodiments.

FIG. 2F-2 is a cross-sectional view of an exemplary micro light-emitting display in accordance with some embodiments.

FIG. 3D-1 is a cross-sectional view of an exemplary micro light-emitting display in accordance with some embodiments.

FIG. 1D-2 is a cross-sectional view of an exemplary micro light-emitting display in accordance with some embodiments.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed.

Figure 1A:
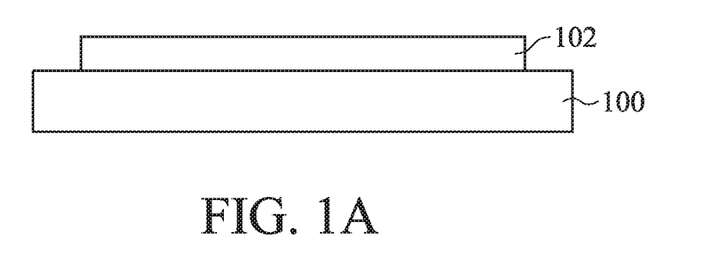
FIGS. 1A to 1G are cross-sectional views of an exemplary method of forming a micro light-emitting display in accordance with some embodiments.
Figure 1B:
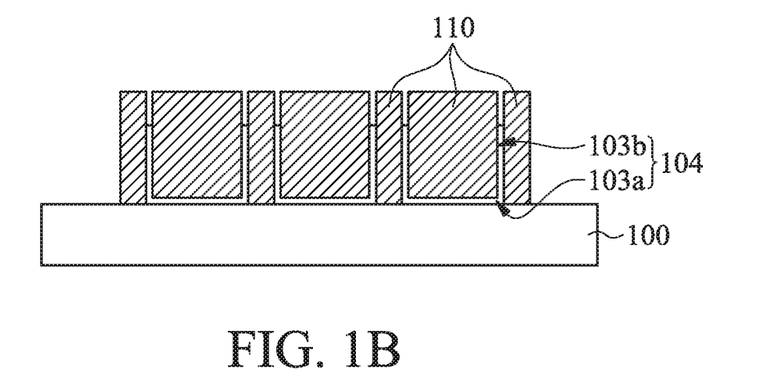

Refer to FIGS. 1A to 1G, which illustrates cross-sectional views of an exemplary method of forming a micro light-emitting display 10a in accordance with some embodiments. As shown in FIGS. 1A and 1B, transparent micro-caps 104 are formed on a substrate 100. In some embodiments, the formation of those transparent micro-caps 104 includes providing a substrate 100 to serve as a support for a material (such as a transparent molding material) of the micro-caps during subsequently forming the transparent micro-caps 104. Therefore, the substrate 100 is also referred to as a carrier substrate. Afterwards, a transparent molding material 102 is formed on the substrate 100, as shown in FIG. 1A. In some embodiments, the transparent molding material 102 includes a transparent plastic, such as polycarbonate (PC), polymethyl methacrylate (PMMA), polystyrene (PS), polyethylene terephthalate (PET), poly(ethylene terephthalateco-1,4-cylclohexylenedimethylene terephthalate) (PETG), styrene-Acrylonitrile resin (SAN), butadiene styrene copolymers (BS), MS, methyl-methacrylate butadiene styrene (MBS), acrylonitrile butadiene styrene copolymers (ABS), polypropylene (PP), polyamide (PA), or another suitable transparent material.

Next, as shown in FIG. 1B, in some embodiments, a molding process is performed on the transparent molding material 102 by using a mold 110, so as to form transparent micro-caps 104 on the substrate 100. In order to simplify the diagram, only three complete transparent micro-caps 104 are depicted in FIG. 1B. Each of the transparent micro-caps 114 includes a plate portion 103a and a dam portion 103b. The clam portion 103b is located at the edge of the plate portion 103a and surrounds the plate portion 103a to form a cap structure with a U-shaped profile. These transparent micro-caps 104 are used for subsequently placing color material layers (which are also referred to as color conversion layers) having the same color. In addition, in some embodiments, the transparent micro-caps 106 and 108 (not shown and depicted in FIG. 1D) can be formed by a method that is the same as the method shown in FIGS. 1A and 1B, so as to place color material layers having other colors. Similar to the transparent micro-caps 104, each of the transparent micro-caps 106 includes a plate portion 105a and a dam portion 105b (not shown and depicted in FIG. 1D) to form a cap structure with a U-shaped profile. Moreover, each of the transparent micro-caps 108 includes a plate portion 107a and a dam portion 107b (not shown and depicted in FIG. 1D) to form a cap structure with U-shaped profile.

Figure 1C:
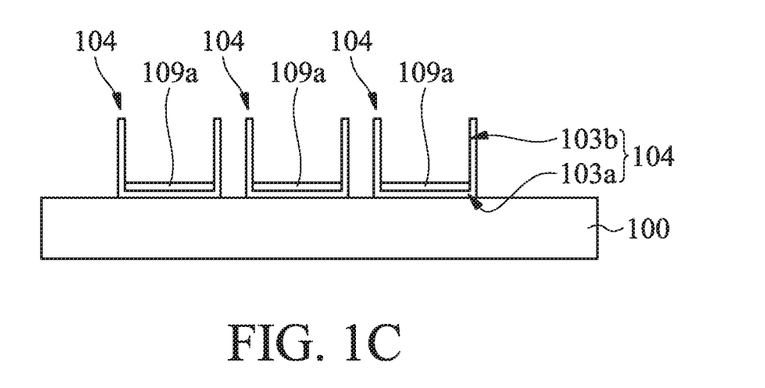
Figure 1D:
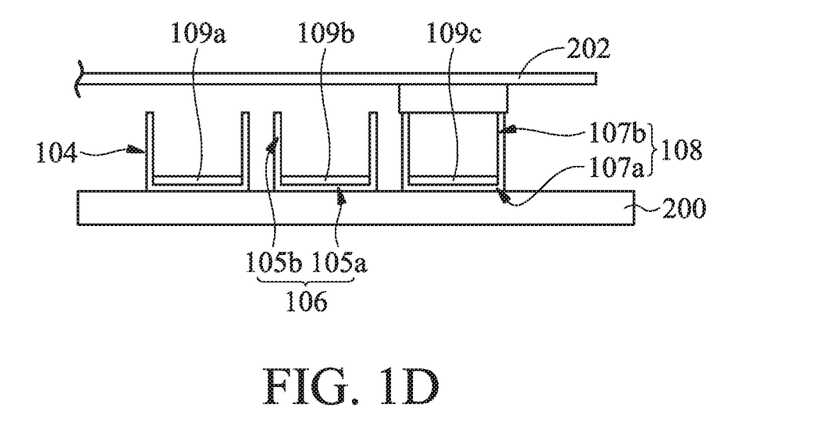

As shown in FIG. 1C, after the transparent micro-caps 104, 106, and 108 are formed, a color material layer 109a is formed on the plate portion 103a of each transparent micro-cap 104 that is disposed on the substrate 100. Similarly, a color material layer 109b is formed on the plate portion 105a of each transparent micro-cap 106 (as depicted in FIG. 1D) and a color material layer 109c is formed on the plate portion 107a of each transparent micro-cap 106 (as depicted in FIG. 1D). For example, the color material layer is formed on the inner surface of the corresponding plate portion.

In some embodiments, the color material layers 109a, 109b, and 109c includes a quantum dot (QD) material, a color filter material (e.g., a resin material), a fluorescent material, or a combination thereof. For example, the color material layers 109a, 109b, and 109c may be a red color filter material, a green color filter material, and a blue color filter material, respectively.

As shown in FIG. 1D, in some embodiments, a transfer machine 202 is employed to remove these transparent micro-caps 104, 106, and 108 from the substrate 100, and then successively attaching them onto a temporary placement substrate 200. These transparent micro-caps 104, 106, and 108 can be separated from each other by a distance and arranged in an array. In order to simplify the diagram, three transparent micro-caps 104, 106, and 108 having a color material layer (e.g., the color material layers 109a, 109b, and 109c) with different colors from each other are depicted in FIG. 1D.

Figure 1E:
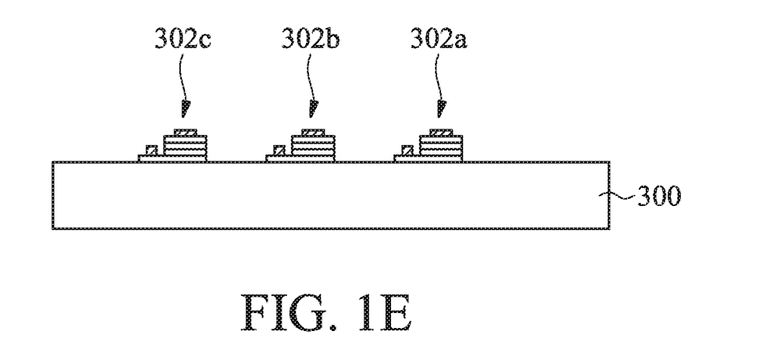

As shown in FIG. 1E, micro light-emitting devices 302a, 302b, and 302c are formed on a substrate 300 (such as a glass substrate, a quartz substrate, a sapphire substrate, or another suitable substrate). In some embodiments, these micro light-emitting devices 302a, 302b, and 302c include monochrome micro light-emitting diodes, such as blue micro light-emitting diodes. In some other embodiments, these micro light-emitting devices 302a, 302b, and 302c include micro light-emitting diodes with different colors. The micro light-emitting devices 302a, 302b, and 302c are arranged in an array. In order to simplify the diagram, only three micro light-emitting devices 302a, 302b, and 302c are depicted in FIG. 1E. In some embodiments, the arrangements of the transparent micro-caps 104, 106, and 108 respectively correspond to the arrangements of the micro light-emitting devices 302a, 302b, and 302c. Moreover, it should be understood that there is no specific order for the formation of the transparent micro-caps and the formation of the micro light-emitting devices on the substrate.

Figure 1F:
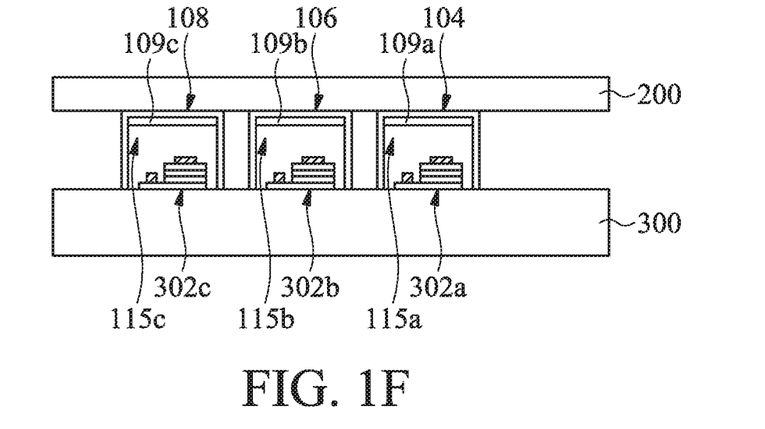

As shown in 1F, the structure shown in FIG. 1D is flipped. Afterwards, the dam portion 103b of the transparent micro-cap 104 having the color material layer 109a, the dam portion 105b of the transparent micro-cap 106 having the color material layer 109b, and the dam portion 107b of the transparent micro-cap 108 having the color material layer 109c are bonded onto the substrate 300. As a result, the plate portion of each transparent micro-cap is disposed opposite the substrate 300. Moreover, the dam portion of each transparent micro-cap is between the substrate 300 and the corresponding plate portion. Therefore, the substrate 300, the plate portion 103a, and the dam portion 103b form a chamber 115a. The substrate 300, the plate portion 105a, and the dam portion 105b form a chamber 115b. The substrate 300, the plate portion 107a, and the dam portion 107b form a chamber 115c. Moreover, the color material layer 109a is disposed in the chamber 115a and faces to the micro light-emitting device 302a, the color material layer 109b is disposed in the chamber 115b and faces to the micro light-emitting device 302b, and the color material layer 109c is disposed in the chamber 115c and faces to the micro light-emitting device 302c.

In some embodiments, the chambers 115a, 115b, and 115c are in a vacuum. In some other embodiments, the chambers 115a, 115b, and 115c are filled a non-solid and non-liquid state medium, such as air or an inert gas (e.g., an argon gas, a xenon gas, a helium gas, a neon gas, or another suitable gas). As a result, the heat generated from the micro light-emitting devices 302a, 302b, and 302c can be thermally isolated via the vacuum chambers (such as the chambers 115a, 115b, and 115c) or via the air or the inert gas in the chambers. Therefore, the heat-accumulation effect can be lowered, to prevent or mitigate aging of the color material layers 109a, 109b, and 109c.

Figure 1G:
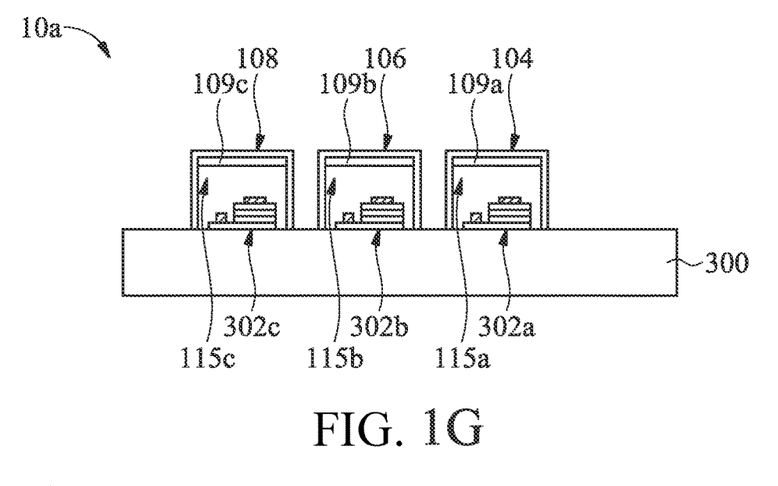

Afterwards, the temporary placement substrate 200 is removed to form the micro light-emitting display 10a, as shown in FIG. 1G. Since the micro light-emitting display 10a with transparent micro-caps is capable of lowering the heat-accumulation effect, the performance and reliability of the micro light-emitting devices can be increased. As a result, the quality of the micro light-emitting display 10a is increased.

FIG. 1G-1 illustrates a cross-sectional view of an exemplary micro light-emitting display 10b in accordance with some embodiments. Elements in FIG. 1G-1 that are the same as those in FIG. 1G are labeled with the same reference numbers as in FIG. 1G and are not described again for brevity. As shown in FIG. 1G-1, the structure of the micro light-emitting display 10*b* is similar to the structure of the micro light-emitting display 10*a* shown in FIG. 1G. Unlike the micro light-emitting display 10*a*, the micro light-emitting display 10*b* further includes a light-shielding structure 120 disposed on the outer surface of the dam portions 103*b*, 105*b*, and 107*b* (not indicated in FIG. 1G-1, and as indicated in FIGS. 1B and 1D) and between the dam portions 103*b*, 105*b*, and 107*b*.

Figure 1G:
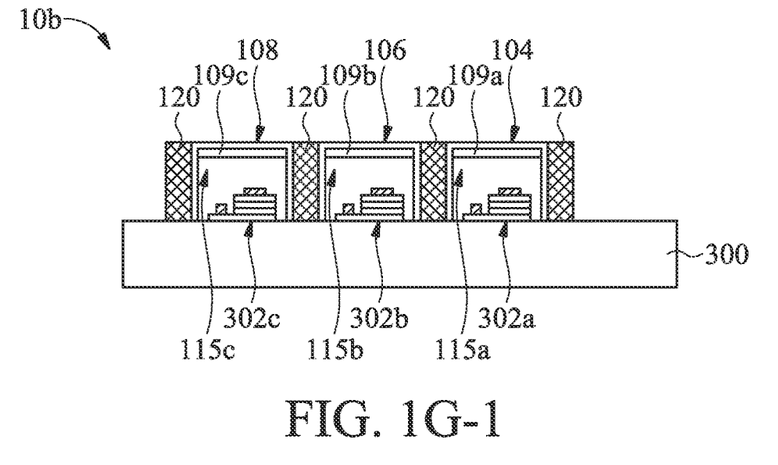

In some embodiments, the light-shielding structure 120 surrounds the color material layers 109*a*, 109*b*, and 109*c* and the micro light-emitting devices 302*a*, 302*b*, and 302*c*. In some embodiments, the light-shielding structure 120 is made of a black matrix (BM) material, to prevent the colors of the micro light-emitting devices 302*a*, 302*b*, and 302*c* from mixing. As a result, the color saturation and contrast of the micro light-emitting display 10*b* can be enhanced.

In some embodiments, the micro light-emitting display 10*b* can be formed by a method that is the same as or similar to the method used in FIGS. 1A to 1G. However, the light-shielding structure 120 can be formed on the outer surface of the dam portions 103*b*, 105*b*, and 107*b* and between the dam portions 103*b*, 105*b*, and 107*b* before, during, or after the formation of the color material layers 109*a*, 109*b*, and 109*c*. Since the micro light-emitting display 10*b* also has transparent micro-caps, the heat-accumulation effect can be lowered, thereby increasing the quality of the micro light-emitting display 10*b*.

FIG. 1G-2 illustrates a cross-sectional view of an exemplary micro light-emitting display 10*c* in accordance with some embodiments. Elements in FIG. 1G-2 that are the same as those in FIG. 1G or 1G-1 are labeled with the same reference numbers as in FIG. 1G or 1G-1 and are not described again for brevity. As shown in FIG. 1G-2, the structure of the micro light-emitting display 10*c* is similar to the structure of the micro light-emitting display 10*a* shown in FIG. 1G. Unlike the micro light-emitting display 10*a*, the micro light-emitting display 10*c* further includes a light-shielding structure 120. The light-shielding structure 120 is disposed on the inner surface of the dam portions 103*b*, 105*b*, and 107*b* (not indicated in FIG. 1G-2, and as indicated in FIGS. 1B and 1D), so that the light-shielding structure 120 surrounds the color material layers 109*a*, 109*b*, and 109*c* and the micro light-emitting devices 302*a*, 302*b*, and 302*c*.

Figure 1G:
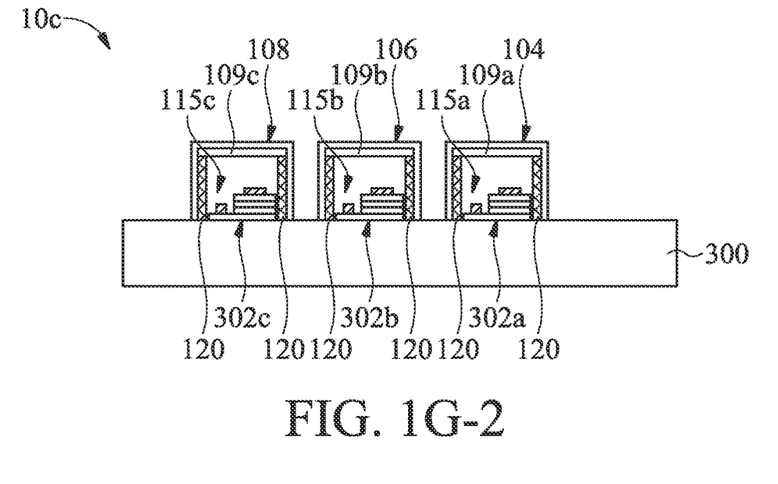

In some embodiments, the micro light-emitting display 10*c* can be formed by a method that is the same as or similar to the method used in FIG. 1A to 1G. However, the light-shielding structure 120 can be formed on the inner surface of the dam portions 103*b*, 105*b*, and 107*b* before, during, or after the formation of the color material layers 109*a*, 109*b*, and 109*c*. Since the micro light-emitting display 10*c* also has transparent micro-caps, the heat-accumulation effect can be lowered, thereby increasing the quality of the micro light-emitting display 10*c*.

Figure 2A:
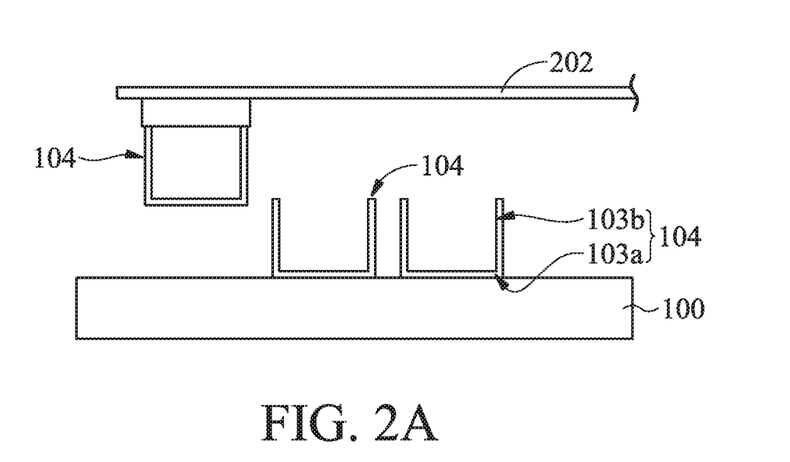
FIGS. 2A to 2F are cross-sectional views of an exemplary method of forming a micro light-emitting display in accordance with some embodiments.

Refer to FIGS. 2A to 2F, which illustrates cross-sectional views of an exemplar y method of forming a micro light-emitting display 10*d* in accordance with some embodiments. Elements in FIGS. 2A to 2F that are the same as those in FIGS. 1A to 1G are labeled with the same reference numbers as in FIGS. 1A to 1G and are not described again for brevity. Refer to FIG. 2A, transparent micro-caps 104 are formed on a substrate 100 by a method that is the same as or similar to the method used in FIGS. 1A to 1B. In order to simplify the diagram, only three complete transparent micro-caps 104 are depicted in FIG. 2A. Each of the transparent micro-caps 104 includes a plate portion 103*a* and a dam portion 103*b*. Next, in some embodiments, these transparent micro-caps 104 are successively removed from the substrate 100 by using a transfer machine 202. In order to simplify the diagram, FIG. 2A merely depicts that a single transparent micro-cap 104 is removed.

Figure 2B:
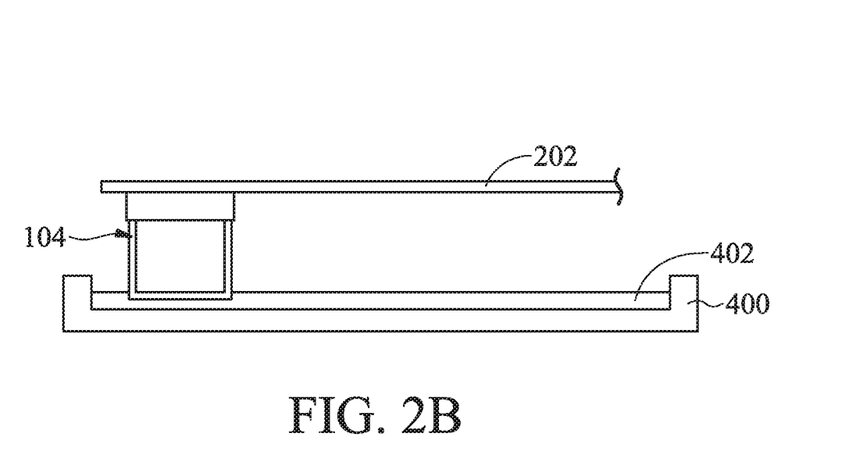

Afterwards, refer to FIG. 2B, these transparent micro-caps 104 are successively immersed in a color material solution 402 in a container 400 (as shown in FIG. 2B), thereby forming a color material layer 109*a* on the plate portion 103*a* (as indicated in FIG. 2A) of each transparent micro-cap 104. For example, the color material layer 109*a* is formed on the outer surface of the corresponding plate portion 103*a*. In order to simplify the diagram, FIG. 2B merely depicts a single transparent micro-cap 104 immersed in the color material solution 402 in the container 400.

Figure 2C:
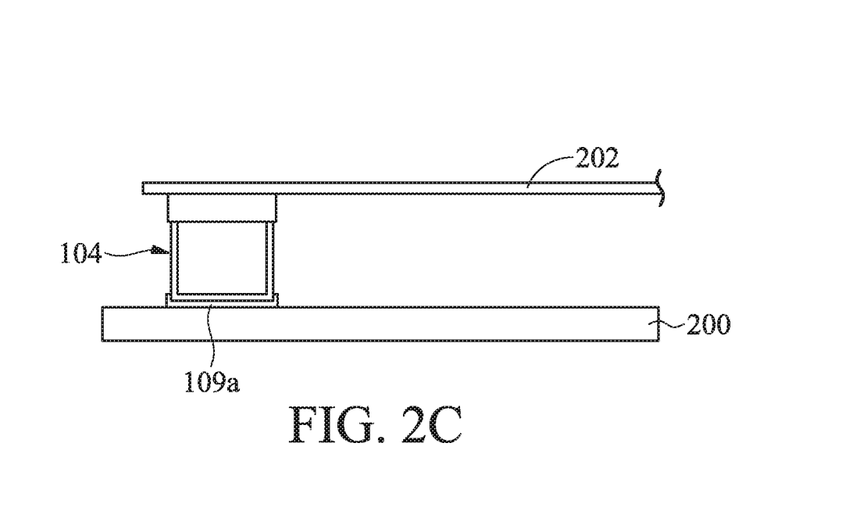

Refer to FIG. 2C, after the transparent micro-caps 104 are removed from the container 400 and the color material layers 109*a* are formed, the color material layer 109*a* of these transparent micro-caps 104 are successively attached onto a temporary placement substrate 200 by using a transfer machine 202. In order to simplify the diagram, FIG. 2C merely depicts that the color material layer 109*a* of a single transparent micro-cap 104 is attached onto the temporary placement substrate 200.

In addition, in some embodiments, transparent micro-caps 106 and 108 (not shown and depicted in FIG. 2D) can be formed by a method that is the same as or similar to the method used in FIGS. 2A to 2C. Each transparent micro-cap 106 includes a plate portion 105*a* and a dam portion 105*b* (not shown and depicted in FIG. 2D). Moreover, each transparent micro-cap 108 includes a plate portion 107*a* and a dam portion 107*b* (not shown and depicted in FIG. 2D).

Figure 2D:
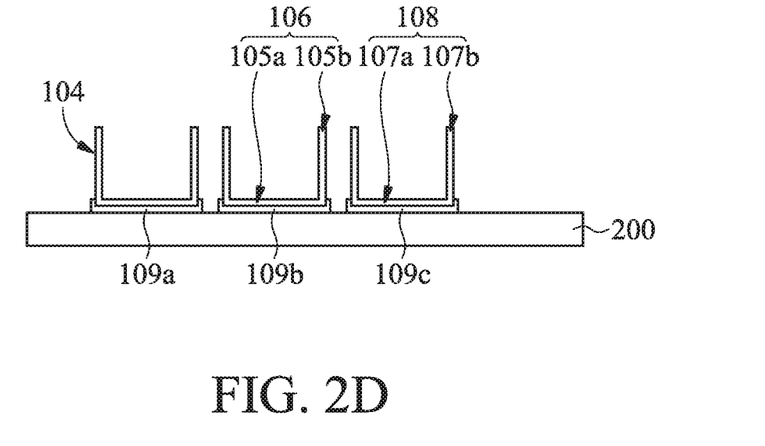

After the transparent micro-caps 104, 106 and 108 are formed, a color material layer 109*b* is formed on the plate portion 105*a* of each transparent micro-cap 106, and a color material layer 109*c* is formed on the plate portion 107*a* of each transparent micro-cap 108. For example, the color material layer is formed on the outer surface of the corresponding plate portion.

Refer to FIG. 2D, in some embodiments, the color material layer 209*b* of those transparent micro-cap 106 and the color material layer 209*c* of those transparent micro-cap 108 are also attached onto the temporary placement substrate 200. The transparent micro-caps 104, 106, and 108 can be separated from each other by a distance and arranged in an array. In order to simplify the diagram, FIG. 2D merely depicts the color material layer 109*a* of a single transparent micro-cap 104, the color material layer 109*b* of a single transparent micro-cap 106, and the color material layer 109*c* of a single transparent micro-cap 108, which are attached onto the temporary placement substrate 200.

Figure 2E:
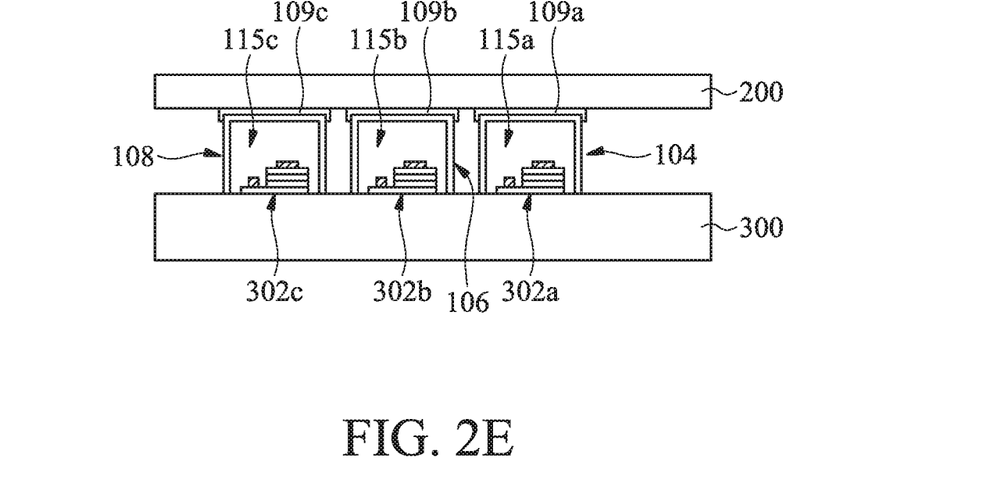

Refer to FIG. 2E, micro light-emitting devices 302*a*, 302*b*, and 302*c* are formed on a substrate 300. In order to simplify the diagram, FIG. 2E merely depicts three micro light-emitting devices 302*a*, 302*b*, and 302*c*.

After the structure shown in FIG. 2E is flipped, the dam portion 103*b* of the transparent micro-cap 104 having the color material layer 109*a*, the dam portion 105*b* of the transparent micro-cap 106 having the color material layer 109*b*, and the dam portion 107*b* of the transparent micro-cap 108 having the color material layer 109*c* are bonded onto the substrate 300. As a result, the substrate 300, the plate portion 103*a*, and the dam portion 103*b* form a chamber 115*a*. The substrate 300, the plate portion 105*a*, and the dam portion 105*b* form a chamber 115*b*. The substrate 300, the plate portion 107*a*, and the dam portion 107*b* form a chamber 115*c*, Moreover, the color material layer 109*a* is disposed on the outer surface of the plate portion 103*a* and opposite the micro light-emitting device 302a, the color material layer 109b is disposed on the outer surface of the plate portion 105a and opposite the micro light-emitting device 302b, and the color material layer 109c is disposed on the outer surface of the plate portion 107a and opposite the micro light-emitting device 302c.

In some embodiments, the chambers 115a, 115b, and 115c are in a vacuum. In some other embodiments, the chambers 115a, 115b, and 115c are filled with a non-solid and non-liquid state medium, such as air or an inert gas. As a result, the heat generated from the micro light-emitting devices 302a, 302b, and 302c can be thermally isolated via the vacuum chambers (such as the chambers 115a, 115b, and 115c) or via the air or the inert gas in the chambers. Therefore, the heat-accumulation effect can be lowered, to prevent or mitigate aging of the color material layers 109a, 109b, and 109c.

Figure 2F:
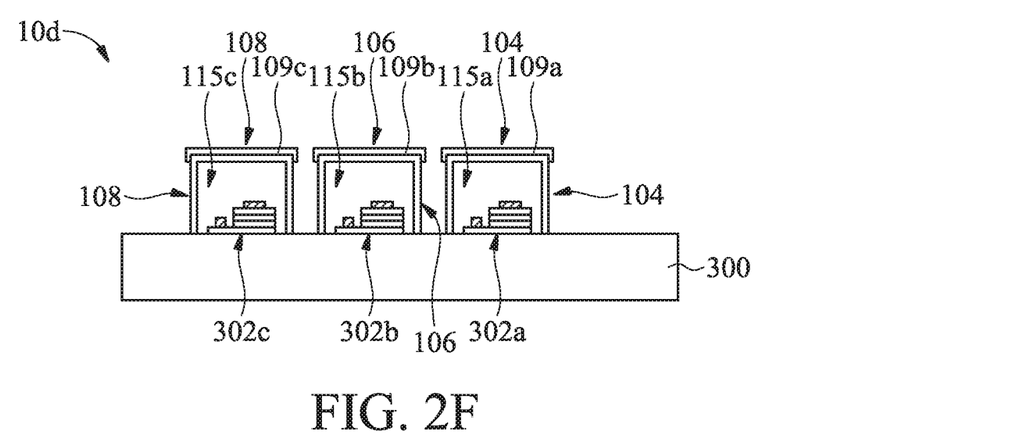

Afterwards, the temporary placement substrate 200 is removed to form the micro light-emitting display 10d, as shown in FIG. 2F. Since the micro light-emitting display 10d with transparent micro-caps is capable of lowering the heat-accumulation effect, the performance and reliability of the micro light-emitting devices can be increased. As a result, the quality of the micro light-emitting display 10d is increased.

FIG. 2F-1 illustrates a cross-sectional view of an exemplary micro light-emitting display 10e in accordance with some embodiments. Elements in FIG. 2F-1 that are the same as those in FIG. 2F are labeled with the same reference numbers as in FIG. 2F and are not described again for brevity. As shown in FIG. 2F-1, the structure of the micro light-emitting display 10e is similar to the structure of the micro light-emitting display 10d shown in FIG. 2F. Unlike the micro light-emitting display 10d, the micro light-emitting display 10e further includes a light-shielding structure 120 disposed on the outer surface of the dam portions 103b, 105b, and 107b (not indicated in FIG. 2F-1, and as indicated in FIGS. 2A and 2D) and between the dam portions 103b, 105b, and 107b.

Figure 2F:
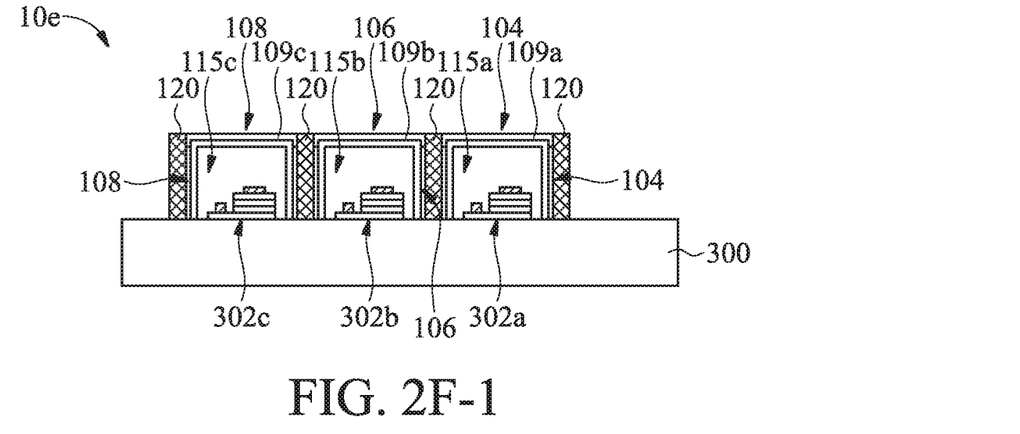

In some embodiments, the light-shielding structure 120 surrounds the color material layers 109a, 109b, and 109c and the micro light-emitting devices 302a, 302b, and 302c. In some embodiments, the light-shielding structure 120 is made of a black matrix (BM) material, to prevent the colors of the micro light-emitting devices 302a, 302b, and 302c from mixing. As a result, the color saturation and contrast of the micro light-emitting display 10e can be enhanced.

In some embodiments, the micro light-emitting display 10e can be formed by a method that is the same as or similar to the method used in FIG. 2A to 2F. However, the light-shielding structure 120 can be formed on the outer surface of the dam portions 103b, 105b, and 107b and between the dam portions 103b, 105b, and 107b before, during, or after the formation of the color material layers 109a, 109b, and 109c. Since the micro light-emitting display 10e also has transparent micro-caps, the heat-accumulation effect can be lowered, thereby increasing the quality of the micro light-emitting display 10e.

FIG. 2F-2 illustrates a cross-sectional view of an exemplary micro light-emitting display 10f in accordance with some embodiments. Elements in FIG. 2F-2 that are the same as those in FIG. 2F or 2F-1 are labeled with the same reference nut fibers as in FIG. 2F or 2F-1 and are not described again for brevity. As shown in FIG. 2F-2, the structure of the micro light-emitting display 10f is similar to the structure of the micro light-emitting display 10d shown in FIG. 2F. Unlike the micro light-emitting display 10d, the micro light-emitting display 10f further includes a light-shielding structure 120. The light-shielding structure 120 is disposed on the inner surface of the dam portions 103b, 105b, and 107b (not indicated in FIG. 2F-2, and as indicated in FIGS. 2A and 2D), so that the light-shielding structure 120 surrounds the color material layers 109a, 109b, and 109c and the micro light-emitting devices 302a, 302b, and 302c.

Figure 2F:
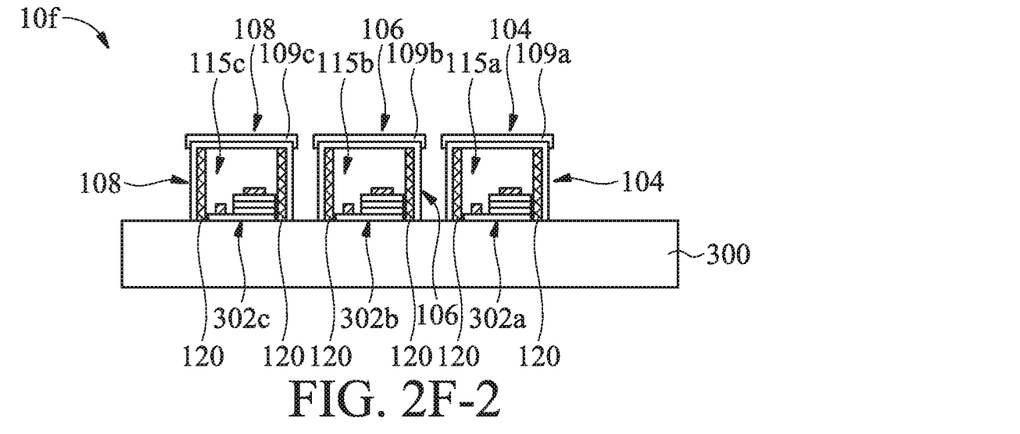

In some embodiments, the micro light-emitting display 10f can be formed by a method that is the same as or similar to the method used in FIG. 2A to 2F. However, the light-shielding structure 120 can be formed on the inner surface of the dam portions 103b, 105b, and 107b before, during, or after the formation of the color material layers 109a, 109b, and 109c. Since the micro light-emitting display 10f also has transparent micro-caps, the heat-accumulation effect can be lowered, thereby increasing the quality of the micro light-emitting display 10f.

Figure 3A:
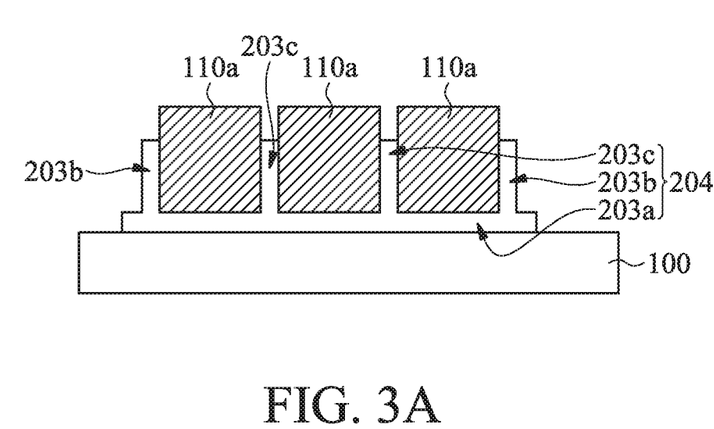
FIGS. 3A to 3D are cross-sectional views of an exemplary method of forming a micro light-emitting display in accordance with some embodiments.

Refer to FIGS. 3A to 3D, which illustrates cross-sectional views of an exemplary method of forming a micro light-emitting display 10g in accordance with some embodiments. Elements in FIGS. 3A to 3D that are the same as those in FIGS. 1A to 1G are labeled with the same reference numbers as in FIGS. 1A to 1G and are not described again for brevity. As shown in FIG. 3A, a transparent micro-cap 204 is formed on a substrate 100. In some embodiments, the formation of the transparent micro-cap 204 includes providing a substrate 100. Afterwards, a transparent molding material (not shown) is formed on the substrate 100. In some embodiments, the transparent molding material is the same as or similar to the transparent molding material 102 shown in FIG. 1A.

Next, a molding process is performed on the transparent molding material by using a mold 110a. Unlike the transparent micro-cap 104 shown in FIG. 1A, the transparent micro-cap 204 has recesses (i.e., the space for placement of the mold 110a). Each transparent micro-cap 204 includes a plate portion 203a, a dam portion 203b, and one or more spacer portions 203c. The dam portion 203b is located at the edge of the plate portion 203a and surrounds the plate portion 203a to form a cap structure with a U-shaped profile. The spacer portions 203c are located on the plate portion 203a, and the dam portion 203b surrounds the spacer portions 203c, to form at least two recesses in the transparent micro-cap 204. These recesses are separated from each other by a distance and arranged in an array. In order to simplify the diagram, FIG. 3A merely depicts the transparent micro-cap 204 having two spacer portions 203c, so that there are three recesses formed in the transparent micro-cap 204.

Figure 3B:
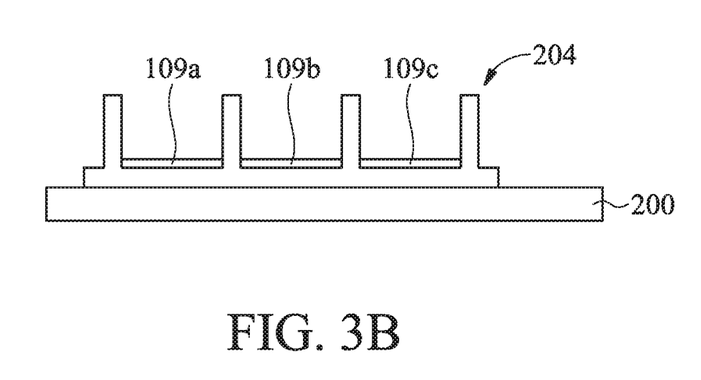

Refer to FIG. 3B, in some embodiments, after the transparent micro-cap 204 is formed, the mold 110a is removed and then the transparent micro-cap 204 is attached onto a temporary placement substrate 200 by using a transfer machine (not shown). Afterwards, color material layers 109a, 109b, and 109c are respectively formed on the plate portions 203a (indicate in FIG. 3A) of the transparent micro-cap 204 by spraying, coating, printing, or another suitable method. For example, color material layers 109a, 109b, and 109c are respectively formed on the bottom of the recesses of the transparent micro-cap 204.

Figure 3C:
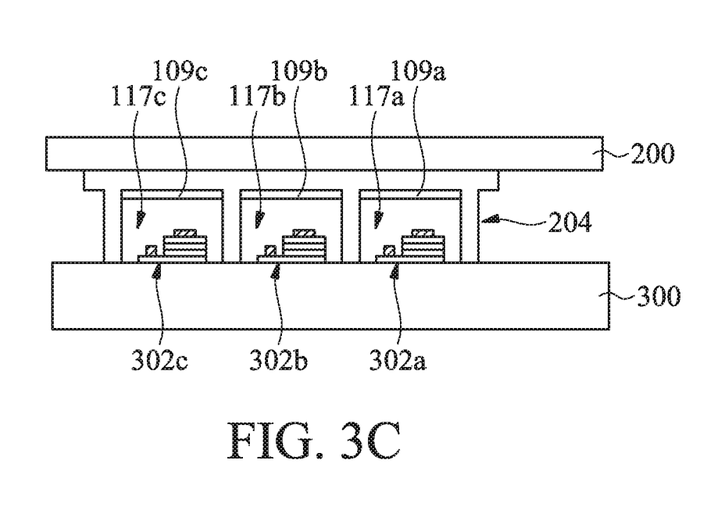

Refer to FIG. 3C, micro light-emitting devices 302a, 302b, and 302c are formed on a substrate 300 by a method that is the same as or similar to the method used in FIG. 1E. These micro light-emitting devices 302a, 302b, and 302c may be arranged in an array. In order to simplify the diagram, FIG. 3C merely depicts three micro light-emitting devices 302a, 302b, and 302c. In some embodiments, the arrangement of the recesses of the transparent micro-cap 204 corresponds to that of the micro light-emitting devices 302a, 302b, and 302c. Moreover, it should be understood that there is no specific order for the formation of the transparent micro-cap and the formation of the micro light-emitting devices on the substrate.

Next, the structure shown in FIG. 3B is flipped. Afterwards, the dam portion 203b (indicated in FIG. 3A) and the spacer portions 203c (indicated in FIG. 3A) of the transparent micro-cap 204 having the color material layers 109a, 109b, and 109c are bonded onto the substrate 300. As a result, the plate portion 203a (indicated in FIG. 3A) of the transparent micro-cap 204 is disposed opposite the substrate 300. Moreover, the dam portion 203b and the spacer portions 203c of the transparent micro-cap 204 are between the substrate 300 and the plate portion 203a. Therefore, the substrate 300, the plate portion 203a, and the dam portion 203b form a chamber (not shown). Moreover, the chamber is divided into three sub-chambers 117a. 117b, and 117c by the spacer portions 203c, so that the micro light-emitting device 302a, 302b, and 302c are respectively disposed in the three sub-chambers 117a, 117b, and 117c and respectively correspond to the color material layers 109a, 109b, and 109c. The color material layers 109a, 109b, and 109c are respectively disposed in the sub-chambers 117a, 117b, and 117c and respectively face the micro emitting device 302a, 302b, and 302c.

In some embodiments, the sub-chambers 117a, 117b, and 117c are in a vacuum. In some other embodiments, the sub-chambers 117a, 117b, and 117c are filled with a non-solid and non-liquid state medium, such as air or an inert gas. As a result, the heat generated from the micro light-emitting devices 302a, 302b, and 302c can be thermally isolated via the vacuum sub-chambers (such as the sub-chambers 117a, 117b, and 117c) or via the air or the inert gas in the sub-chambers. Therefore, the heat-accumulation effect can be lowered, to prevent or mitigate aging of the color material layers 109a, 109b, and 109c.

Figure 3D:
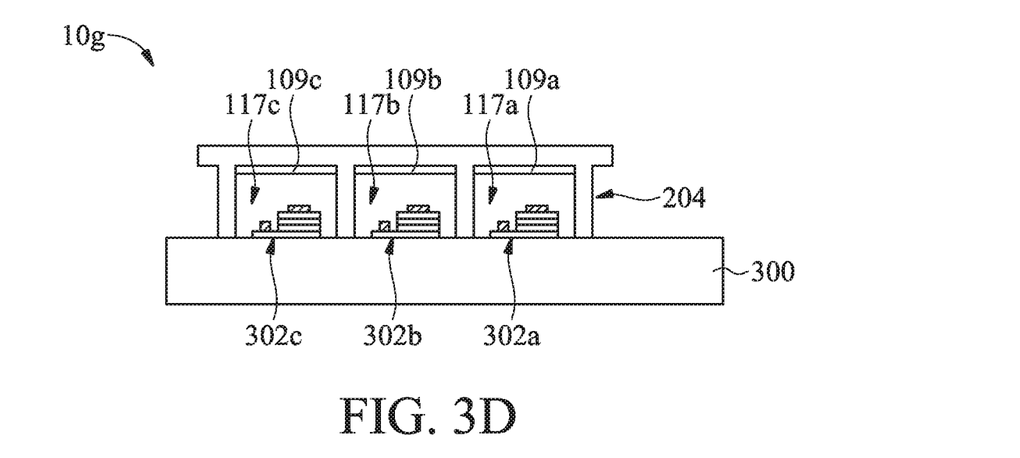

Afterwards, the temporary placement substrate 200 is removed to form the micro light-emitting display 10g, as shown in FIG. 3D. Since the micro light-emitting display 10g with the transparent micro-cap is capable of lowering the heat-accumulation effect, the performance and reliability of the micro light-emitting devices can be increased. As a result, the quality of the micro light-emitting display 10g is increased.

Figure 3D:
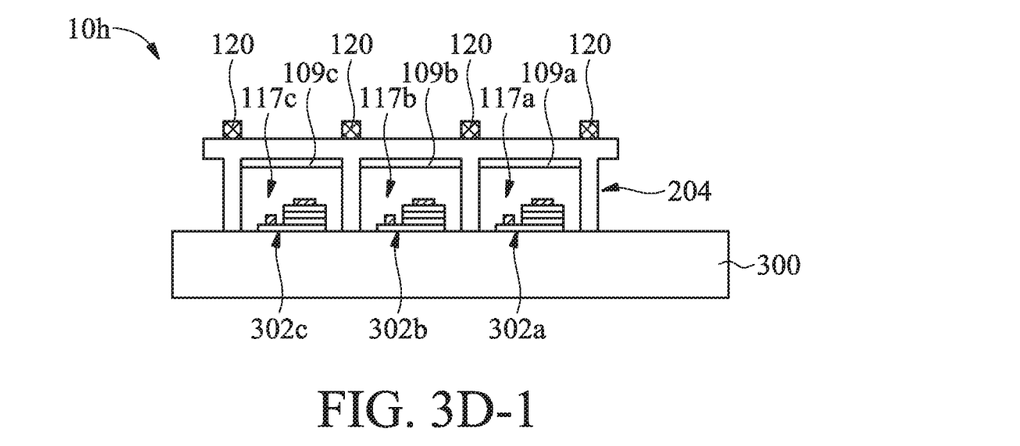

FIG. 3D-1 illustrates a cross-sectional view of an exemplary micro light-emitting display 10h in accordance with some embodiments. Elements in FIG. 3D-1 that are the same as those in FIG. 3D are labeled with the same reference numbers as in FIG. 3D and are not described again for brevity. As shown in FIG. 3D-1, the structure of the micro light-emitting display 10h is similar to the structure of the micro light-emitting display 10g shown in FIG. 3D. Unlike the micro light-emitting display 10g, the micro light-emitting display 10h further includes a light-shielding structure 120 disposed on the outer surface of the plate portion 203a (not indicated in FIG. 3D-I, and as indicated in FIG. 3A).

In some embodiments, the light-shielding structure 120 surrounds the color material layers 109a, 109b, and 109c and the micro light-emitting devices 302a, 302b, and 302c. In some embodiments, the light-shielding structure 120 is made of a black matrix (BM) material, to prevent the colors of the micro light-emitting devices 302a, 302b, and 302c from mixing. As a result, the color saturation and contrast of the micro light-emitting display 10h can be enhanced.

In some embodiments, the micro light-emitting display 10h can be formed by a method that is the same as or similar to the method used in FIG. 3A to 3D. However, the light-shielding structure 121) can be formed on the outer surface of the plate portion 203a before, during, or after the formation of the color material layers 109a, 109b, and 109c. Since the micro light-emitting display 10h also has the transparent micro-cap, the heat-accumulation effect can be lowered, thereby increasing the quality of the micro light-emitting display 10h.

FIG. 3D-2 illustrates a cross-sectional view of an exemplary micro light-emitting display 10i in accordance with some embodiments. Elements in FIG. 3D-2 that are the same as those in FIG. 3D or 3D-1 are labeled with the same reference numbers as in FIG. 3D or 3D-1 and are not described again for brevity. As shown in FIG. 3D-2, the structure of the micro light-emitting display 10i is similar to the structure of the micro light-emitting display 10g shown in FIG. 3D. Unlike the micro light-emitting display 10g, the micro light-emitting display 10i further includes a light-shielding structure 120. The light-shielding structure 120 is disposed on the inner surface of the dam portion 203b (not indicated in FIG. 3D-2, and as indicated in FIG. 3A) and two opposing sidewall surfaces of each spacer portion 203c, so that the light-shielding structure 121) surrounds the color material layers 109a, 109b, and 109c and the micro light-emitting devices 302a, 302b, and 302c.

Figure 3D:
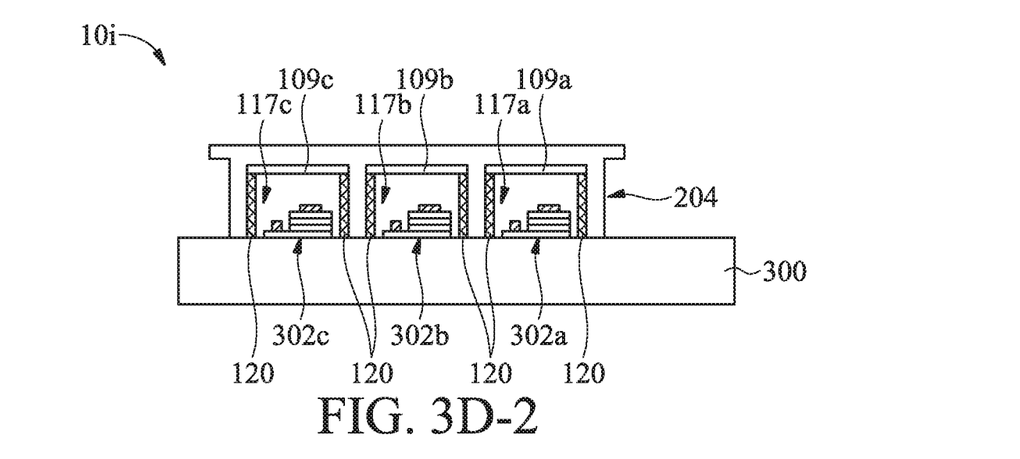

In some embodiments, the micro light-emitting display 10i can be formed by a method that is the same as or similar to the method used in FIG. 3A to 3D. However, the light-shielding structure 120 can be formed on the inner surface of the dam portion 203b and two opposing sidewall surfaces of each spacer portion 203c before, during, or after the formation of the color material layers 109a, 109b, and 109c. Since the micro light-emitting display 10i also has the transparent micro-cap, the heat-accumulation effect can be lowered, thereby increasing the quality of the micro light-emitting display 10i.

Figure 4A:
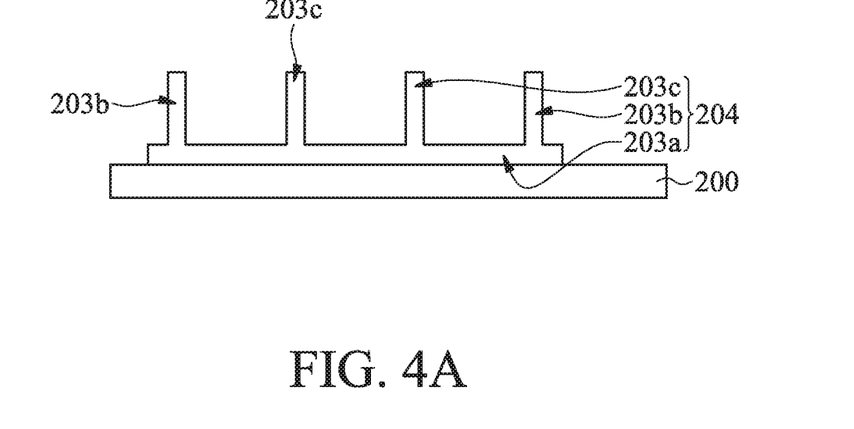
FIGS. 4A to 4D are cross-sectional views of an exemplary method of forming a micro light-emitting display in accordance with some embodiments.

Refer to FIGS. 4A to 4D, which illustrates cross-sectional views of an exemplary method of forming a micro light-emitting display 10j in accordance with some embodiments. Elements in FIGS. 4A to 4D that are the same as those in FIGS. 3A to 3D are labeled with the same reference numbers as in FIGS. 3A to 3D and are not described again for brevity. As shown in FIG. 4A, a transparent micro-cap 204 is formed and attached onto a temporary placement substrate 200 by a method that is the same as or similar to the method used in FIGS. 3A and 3B.

Figure 4B:
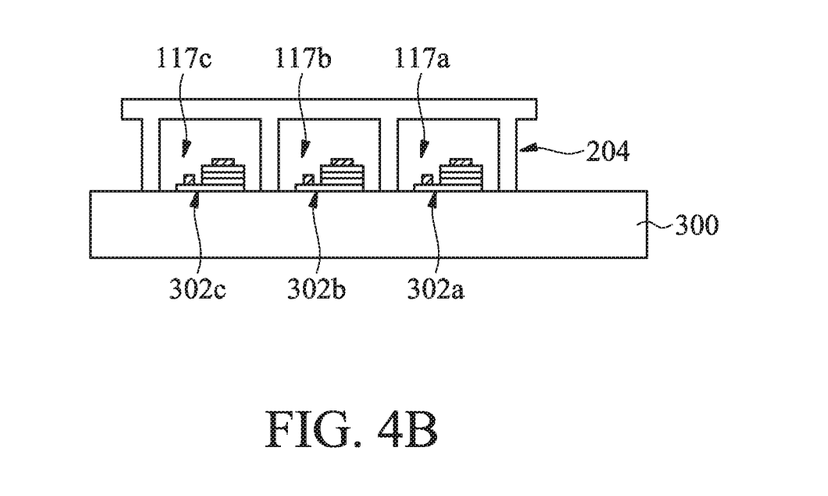

Refer to FIG. 4B, in some embodiments, micro light-emitting devices 302a, 302b, and 302c are formed on a substrate 300 by a method that is the same as or similar to the method used in FIG. 3C. These micro light-emitting devices 302a, 302b, and 302c may be arranged in an array. It should be understood that there is no specific order for the formation of the transparent micro-cap and the formation of the micro light-emitting devices on the substrate.

Next, the structure shown in FIG. 4A is flipped. Afterwards, the dam portion 203b (indicated in FIG. 4A) and the spacer portions 203c (indicated in FIG. 4A) of the transparent micro-cap 204 are bonded onto the substrate 300. As a result, the plate portion 203a (indicated in FIG. 4A) of the transparent micro-cap 204 is disposed opposite the substrate 300. Moreover, the dam portion 203b and the spacer portions 203c of the transparent micro-cap 204 are between the substrate 300 and the plate portion 203a. Therefore, the substrate 300, the plate portion 203a, and the dam portion 203b form a chamber (not shown). Moreover, the chamber is divided into three sub-chambers 117a, 117b, and 117c by the spacer portions 203c, so that the micro light-emitting device 302a, 302b, and 302c are respectively disposed in the three sub-chambers 117a, 117b), and 117c.

In some embodiments, the sub-chambers 117a, 117b, and 117c are in a vacuum. In some other embodiments, the sub-chambers 117a, 117b, and 117c are filled with a non-solid and non-liquid state medium, such as air or an inert gas. As a result, the heat generated from the micro light-emitting devices 302a, 302b, and 302c can be thermally isolated via the vacuum sub-chambers (such as the sub-chambers 117a, 117b, and 117c) or via the air or the inert gas in the sub-chambers. Therefore, the heat-accumulation effect can be lowered, to prevent or mitigate aging of subsequently formed color material layers 109a, 109b, and 109c (as shown in FIG. 4D).

Figure 4C:
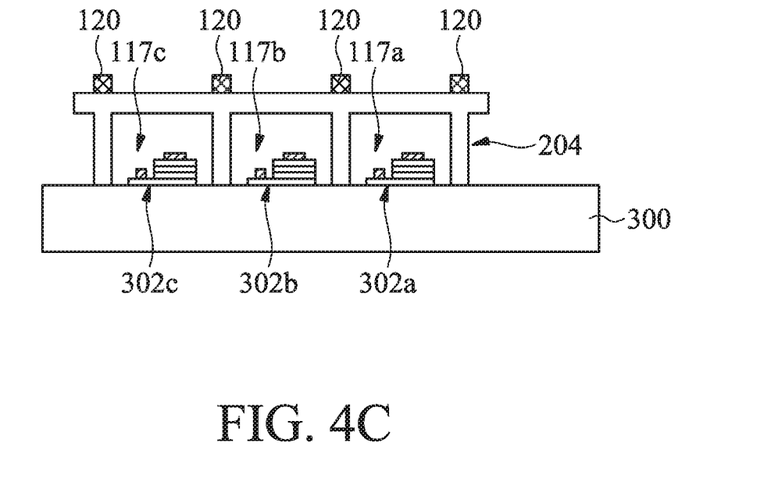
Figure 4D:
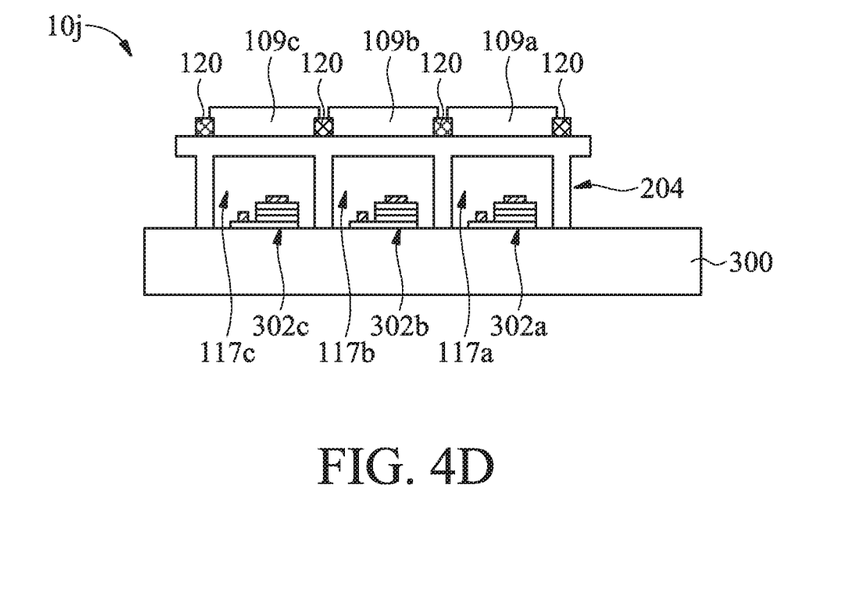

Refer to FIG. 4C, in some embodiments, after the temporary placement substrate 200, a light-shielding structure 120 is formed on the outer surface of the plate portion 203a (not indicated in FIG. 4C, and as indicated in FIG. 4A). In some embodiments, the light-shielding structure 120 surrounds color material layers 109a, 109b, and 109c and the micro light-emitting devices 302a, 302b, and 302c (as shown in FIG. 4D). In some embodiments, the light-shielding structure 120 is made of a black matrix (BM) material, to prevent the colors of the micro light-emitting devices 302a, 302b, and 302c from mixing. As a result, the color saturation and contrast of the micro light-emitting display 10j can be enhanced.

In some embodiments, color material layers 109a, 109b, and 109c are formed by spraying, coating, printing, or another suitable method, to form the micro light-emitting display 10j. However, the light-shielding structure 120 can be formed on the outer surface of the plate portion 203a before, during, or after the formation of the color material layers 109a, 109b, and 109c. The color material layers 109a, 109b, and 109c respectively correspond to the sub-chambers 117a, 117b, and 117c and are disposed on an opposing side of the micro light-emitting devices 302a, 302b, and 302c. Since the micro light-emitting display 10j also has the transparent micro-cap, the heat-accumulation effect can be lowered, thereby increasing the quality of the micro light-emitting display 10j.

Figure 5A:
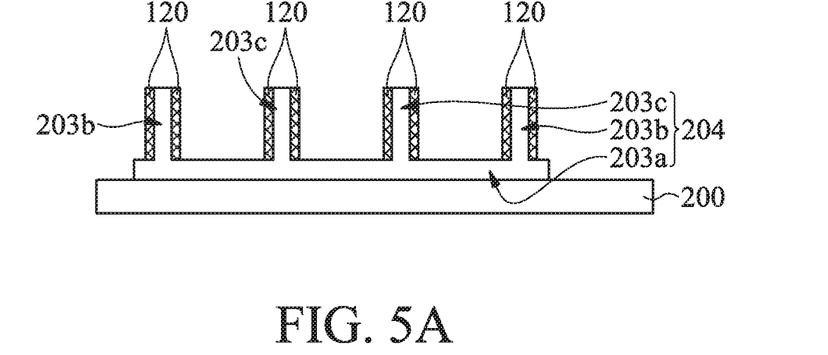
FIGS. 5A to 5C are cross-sectional views of an exemplary method of forming a micro light-emitting display in accordance with some embodiments.
Figure 5B:
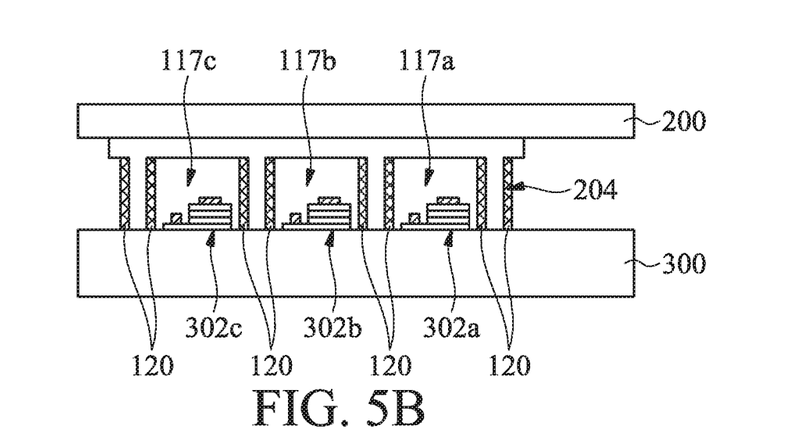
Figure 5C:
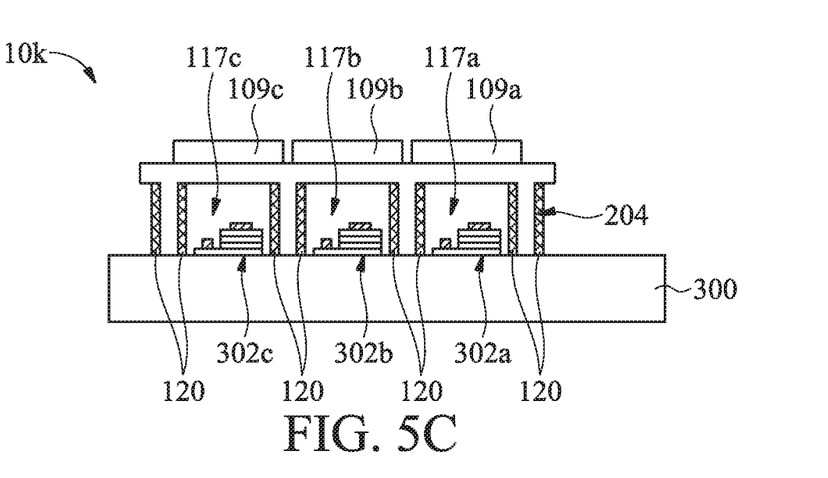

Refer to FIGS. 5A to 5C, which illustrates cross-sectional views of an exemplary method of forming a micro light-emitting display 10k in accordance with some embodiments. Elements in FIGS. 5A to 5C that are the same as those in FIGS. 3A to 3D are labeled with the same reference numbers as in FIGS. 3A to 3D and are not described again for brevity. As shown in FIG. 5A, in some embodiments, a transparent micro-cap 204 is formed and attached onto a temporary placement substrate 200 by a method that is the same as or similar to the method used in FIGS. 3A and 3B. Afterwards, a light-shielding structure 120 is formed on the outer surface of the dam portion 203b and two opposing sidewall surfaces of each spacer portion 203, so that the light-shielding structure 120 surrounds the recesses of the transparent micro-cap 204. In some embodiments, the light-shielding structure 120 is made of a black matrix (BM) material, to prevent the colors of the subsequently formed micro light-emitting devices from mixing. As a result, the color saturation and contrast of the micro light-emitting display 10k can be enhanced.

Refer to FIG. 5B, in some embodiments, micro light-emitting devices 302a, 302b, and 302c are formed on a substrate 300 by a method that is the same as or similar to the method used in FIG. 3C. These micro light-emitting devices 302a, 302b, and 302c may be arranged in an array. It should be understood that there is no specific order for the formation of the transparent micro-cap and the formation of the micro light-emitting devices on the substrate.

Next, the structure shown in FIG. 5A is flipped. Afterwards, the dam portion 203b (indicated in FIG. 5A) and the spacer portions 203c (indicated in FIG. 5A) of the transparent micro-cap 204 are bonded onto the substrate 300. As a result, the plate portion 203a (indicated in FIG. 5A) of the transparent micro-cap 204 is disposed opposite the substrate 300. Moreover, the dam portion 203b and the spacer portions 203c of the transparent micro-cap 204 are between the substrate 31)1) and the plate portion 203a. Therefore, the substrate 300, the plate portion 203a, and the dam portion 203b form a chamber (not shown). Moreover, the chamber is divided into three sub-chambers 117a, 117b, and 117c by the spacer portions 203c, so that the micro light-emitting device 302a, 302b, and 302c are respectively disposed in the three sub-chambers 117a, 117b, and 117c, and the light-shielding structure 120 surrounds the micro light-emitting device 302a, 302b, and 302c.

In some embodiments, the sub-chambers 117a, 117b, and 117c are in a vacuum. In some other embodiments, the sub-chambers 117a, 117b, and 117c are filled with a non-solid and non-liquid state medium, such as air or an inert gas. As a result, the heat generated from the micro light-emitting devices 302a, 302b, and 302c can be thermally isolated via the vacuum sub-chambers (such as the sub-chambers 117a, 117b, and 117c) or via the air or the inert gas in the sub-chambers. Therefore, the heat-accumulation effect can be lowered, to prevent or mitigate aging of subsequently formed color material layers 109a, 109b, and 109c (as shown in FIG. 5C).

Refer to FIG. 5C, in some embodiments, after the temporary placement substrate 200, color material layers 109a, 109b, and 109c are formed on the outer surface of the plate portion 203a (not indicated in FIG. 5C, and as indicated in FIG. 5A) to form the micro light-emitting display 10k.

In some embodiments, color material layers 109a, 109b, and 109c are formed by spraying, coating, printing, or another suitable method. The color material layers 109a, 109b, and 109c respectively correspond to the sub-chambers 117a, 117b, and 117c, so that the light-shielding structure 120 surrounds the micro light-emitting device 302a, 302b, and 302c. Moreover, the color material layers 109a, 109b, and 109c are disposed on an opposing side of the micro light-emitting devices 302a, 302b, and 302c. Since the micro light-emitting display 10k also has the transparent micro-cap, the heat-accumulation effect can be lowered, thereby increasing the quality of the micro light-emitting display 10k.

According to the aforementioned embodiments, since each of the micro light-emitting devices is disposed in the chamber or sub-chamber of the transparent micro-cap, the heat generated from each of the micro light-emitting devices can be thermally isolated via the vacuum chamber or sub-chamber or via the air or the inert gas formed in the vacuum chamber or sub-chamber. Therefore, aging of the color material layers can be prevented or mitigated. As a result, the performance and reliability of the micro light-emitting devices can be effectively increased, thereby increasing the quality of the micro light-emitting display.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A micro light-emitting display, comprising:
a first transparent micro-cap disposed on a substrate, comprising:
a first plate portion disposed opposite the substrate; and
a first dam portion disposed between the substrate and the first plate portion, wherein the substrate, the first plate portion, and the first dam portion form a first chamber;
a first micro light-emitting device disposed on the substrate and within the first chamber, wherein the first chamber is in a vacuum or filled with air or an inert gas;
a first color material layer disposed on the first plate portion and corresponding to the first micro light-emitting device;
a second transparent micro-cap disposed on the substrate and separated from the first transparent micro-cap by a distance, comprising:
a second plate portion disposed opposite the substrate; and
a second dam portion disposed between the substrate and the second plate portion, wherein the substrate, the second plate portion, and the second dam portion form a second chamber, wherein the second chamber is in a vacuum or filled with air or an inert gas;
a second micro light-emitting device disposed on the substrate and within the second chamber; and
a second color material layer disposed on the second plate portion and corresponding to the second micro light-emitting device.

2. The micro light-emitting display as claimed in claim 1, further comprising a light-shielding structure disposed on an outer surface of the first dam portion, on an outer surface of the second dam portion, and between the first dam portion and the second dam portion.

3. The micro light-emitting display as claimed in claim 1, further comprising a light-shielding structure disposed on an inner surface of the first dam portion and an inner surface of the second dam portion.

4. The micro light-emitting display as claimed in claim 1, wherein the first color material layer is disposed on an outer surface of the first plate portion and opposite the first micro light-emitting device, and the second color material layer is disposed on an outer surface of the second plate portion and opposite the second micro light-emitting device.

5. The micro light-emitting display as claimed in claim 1, wherein the first color material layer is disposed in the first chamber and faces the first micro light-emitting device, and the second color material layer is disposed in the second chamber and faces the second micro light-emitting device.

6. The micro light-emitting display as claimed in claim 1, further comprising a light-shielding structure that surrounds the first color material layer and the second color material layer.

7. A method for forming the micro light-emitting display of claim 1, comprising:
forming the first micro light-emitting device on the substrate;
forming the first transparent micro-cap, comprising:
the first plate portion; and
the first dam portion on an edge of the first plate portion to surround the first plate portion;
forming the first color material layer on the first plate portion;
bonding the first dam portion of the first transparent micro-cap with the first color material layer onto the substrate,
forming the second micro light-emitting device on the substrate;
forming the second transparent micro-cap, comprising:
the second plate portion; and
the second dam portion on an edge of the second plate portion to surround the second plate portion;
forming the second color material layer on the second plate portion; and
bonding the second dam portion of the second transparent micro-cap with the second color material layer onto the substrate, and the second dam portion is separated from the first transparent micro-cap by the distance,
wherein the substrate, the first plate portion, and the first dam portion form the first chamber, the first micro light-emitting device is in the first chamber, the substrate, the second plate portion, and the second dam portion form the second chamber, and the second micro light-emitting device is in the second chamber, and wherein the first chamber and the second chamber are in the vacuum or filled with air or the inert gas.

8. The method as claimed in claim 7, further comprising forming a light-shielding structure on an inner surface of the first dam portion and an inner surface of the second dam portion, or forming a light-shielding structure on an outer surface of the first dam portion and an outer surface of the second dam portion, and between the first dam portion and the second dam portion.

9. The method as claimed in claim 7, wherein the first color material layer is disposed on an outer surface of the first plate portion and opposite the first micro light-emitting device, and the second color material layer is disposed on an outer surface of the second plate portion and opposite the second micro light-emitting device, or wherein the first color material layer is disposed in the first chamber and faces the first micro light-emitting device, and the second color material layer is disposed in the second chamber and faces the second micro light-emitting device.

10. A micro light-emitting display, comprising:
a first transparent micro-cap disposed on a substrate, comprising:
a first plate portion disposed opposite the substrate; and
a first dam portion disposed between the substrate and the first plate portion, wherein the substrate, the first plate portion, and the first dam portion form a first chamber;
a first micro light-emitting device disposed on the substrate and within the first chamber, wherein the first chamber is in a vacuum or filled with air or an inert gas; and
a first color material layer disposed on the first plate portion and corresponding to the first micro light-emitting device;
wherein the first transparent micro-cap further comprises at least one spacer portion in the first chamber to divide the first chamber into at least two sub-chambers, and wherein the micro light-emitting display further comprises:
a second micro light-emitting device disposed on the substrate and within the first chamber; and
a second color material layer disposed on the first plate portion, wherein the second micro light-emitting device and the first micro light-emitting device are disposed in the respective sub-chambers.

11. The micro light-emitting display as claimed in claim 10, further comprising a light-shielding structure disposed on an outer surface of the first plate portion.

12. The micro light-emitting display as claimed in claim 10, further comprising a light-shielding structure disposed on inner and outer surfaces of the first dam portion and on two opposing sidewalls of the spacer portion.

13. The micro light-emitting display as claimed in claim 10, wherein the first color material layer and the second color material layer are disposed on an outer surface of the first plate portion.

14. The micro light-emitting display as claimed in claim 10, wherein the first color material layer is disposed in the sub-chamber that has the first micro light-emitting device, and the second color material layer is disposed in the sub-chamber that has the second micro light-emitting device.

15. The micro light-emitting display as claimed in claim 10, further comprising a light-shielding structure that surrounds the first color material layer and the second color material layer.

16. A method for forming the micro light-emitting display of claim 10, comprising:
   forming the first micro light-emitting device on the substrate;
   forming the first transparent micro-cap, comprising:
   the first plate portion; and
   the first dam portion on an edge of the first plate portion to surround the first plate portion;
   forming the first color material layer on the first plate portion; and
   bonding the first dam portion of the first transparent micro-cap with the first color material layer onto the substrate,
   wherein the substrate, the first plate portion, and the first dam portion form the first chamber, and the first micro light-emitting device is in the first chamber, and wherein the first chamber is in the vacuum or filled with air or the inert gas;
   wherein the first transparent micro-cap further comprises the at least one spacer portion on the first plate portion and surrounded by the first dam portion, and wherein the method further comprises:
   forming the second micro light-emitting device on the substrate; and
   forming the second color material layer on the first plate portion,
   wherein after the first dam portion is bonded onto the substrate, the first chamber is divided into the at least two sub-chambers, so that the second micro light-emitting device and the first micro light-emitting device are respectively disposed in the sub-chambers and respectively correspond with the second color material layer and the first color material layer.

17. The method as claimed in claim 16, further comprising forming a light-shielding structure on an outer surface of the first plate portion, or forming a light-shielding structure on inner and outer surfaces of the first dam portion and on two opposing sidewalls of the spacer portion.

18. The method as claimed in claim 16, wherein the first color material layer and the second color material layer are formed on an outer surface of the first plate portion, or the first color material layer is formed in the sub-chamber that has the first micro light-emitting device, and the second color material layer is formed in the sub-chamber that has the second micro light-emitting device.

* * * * *